United States Patent
Ruelke et al.

(10) Patent No.: US 7,203,476 B2
(45) Date of Patent: Apr. 10, 2007

(54) METHOD AND APPARATUS FOR MINIMIZING BASEBAND OFFSET ERROR IN A RECEIVER

(75) Inventors: Charles R. Ruelke, Margate, FL (US); Richard S. Young, Weston, FL (US)

(73) Assignee: Motorola, Inc., Schaumburg, IL (US)

( * ) Notice: Subject to any disclaimer, the term of this patent is extended or adjusted under 35 U.S.C. 154(b) by 428 days.

(21) Appl. No.: 10/754,654

(22) Filed: Jan. 9, 2004

(65) Prior Publication Data
US 2005/0153676 A1   Jul. 14, 2005

(51) Int. Cl.
*H04B 1/26* (2006.01)
(52) U.S. Cl. .................. 455/324; 455/260; 455/234.1; 375/345
(58) Field of Classification Search ................ 375/345; 455/232.1, 240.1, 250.1, 324, 234.1, 296, 455/266, 230, 313, 323, 334, 338, 339, 255–260
See application file for complete search history.

(56) References Cited

U.S. PATENT DOCUMENTS

| | | | | |
|---|---|---|---|---|
| 5,564,094 A | | 10/1996 | Anderson et al. | |
| 5,701,600 A | * | 12/1997 | Wetters et al. | 455/208 |
| 6,166,668 A | * | 12/2000 | Bautista et al. | 341/118 |
| 6,356,217 B1 | * | 3/2002 | Tilley et al. | 341/118 |
| 6,459,889 B1 | * | 10/2002 | Ruelke | 455/296 |
| 6,560,447 B2 | * | 5/2003 | Rahman et al. | 455/232.1 |
| 6,968,166 B2 | * | 11/2005 | Yang | 455/234.1 |
| 6,993,291 B2 | * | 1/2006 | Parssinen et al. | 455/67.11 |
| 2002/0160734 A1 | * | 10/2002 | Li et al. | 455/245.1 |

* cited by examiner

Primary Examiner—Edward Urban
Assistant Examiner—Nhan T. Le

(57) ABSTRACT

An adaptive dc compensation technique (100) eliminates dc error for both digital and constant envelope modulation protocols (108). For analog modulation, a dc averaging technique utilizes piece-wise continuous dc averaging (110) that calculates discrete dc error values over a variable number of samples (112) and updates the dc compensation value as a fixed value for a specified sample length (114). The piece-wise "update-and-hold" technique (110) results in a pseudo high pass filter response with an equivalent corner. For digital modulation, a continuous high pass filter section of the receiver is enabled (120).

11 Claims, 3 Drawing Sheets

… (US 7,203,476 B2)

METHOD AND APPARATUS FOR MINIMIZING BASEBAND OFFSET ERROR IN A RECEIVER

TECHNICAL FIELD

This invention relates in general to receivers, and more particularly to techniques for minimizing baseband offset error in direct conversion receivers.

BACKGROUND

Direct conversion receivers function by mixing a desired radio frequency (RF) signal or intermediate (IF) signal down to baseband, or some very low frequency offset from dc. For direct conversion, the mixer's local oscillator (LO) frequency is approximately equal to the desired RF input frequency. Thus, the magnitude of the baseband dc signal is proportional to that portion of the RF signal that is exactly equal to the LO frequency. Any variations in RF power due to environmental (fading, multi-path) or circuit functionality will affect the dc voltage level at baseband.

The baseband signal of direct conversion receivers may include a parallel I and Q channel configuration, where Q is 90 degrees out of phase with I. Direct conversion receivers generate a residual dc offset error in the baseband I/Q paths due to LO self-mixing and interstage mismatch. The dc offset error manifests itself as an unmodulated, co-channel interferer exactly at 0 Hz on channel, the magnitude of which is directly proportional to the magnitude of the I/Q baseband path dc offset error. For modulation techniques where discrete time-sampled information is embedded in either phase, amplitude or both portions of the carrier frequency (digital modulation strategies), the bit error rate (BER) at sensitivity, minimum BER at strong signal conditions, and signal quality estimates (SQE) can be degraded by excessive dc offset errors. For modulation techniques where the continuous time-varying analog signal is embedded into either the phase, frequency or amplitude portion of the carrier frequency (analog modulation strategies), sensitivity degradation, squelch falsing, audio artifacts that degrade the demodulated audio quality, and even generation of audio tones in the absence of a desired signal (self-quieter) can be attributed to the presence of the co-channel interferer generated by dc offset errors.

Previous strategies to eliminate the undesired dc component utilize various high pass filter (HPF) topologies in either analog and/or digital subsections of the receiver. These strategies are implemented in algorithms in a digital signal processor (DSP) or in analog hardware and are known in the art. While these strategies successfully eliminate dc offset errors, the HPF response induces a spectral "notch" that distorts the received spectrum by eliminating the desired modulated information that also happens to fall within the HPF response. In extremely severe instances (wide HPF corner), the notch effect can degrade sensitivity, and audio quality and prevent carrier detect (sync) when receiving analog or digital modulated signals. For digital protocols, reducing the notch bandwidth to extremely narrow corners relative to the baud rate can mitigate these degradations; however, this can also force the HPF response time to be extremely slow relative to slot lengths and may cause missed slots (sync acquire failed) in dynamic RF environments (fading, multi-path, strong signal IM). For constant envelope, non-slotted modulation strategies (FM, SSB-AM) even narrow notch settings will induce undesired distortion effects that are not resolved by today's HPF implementations.

Accordingly, there is a need for a dc compensation strategy that eliminates the dc error for both digital and constant envelop modulation protocols, while being sufficiently flexible to provide both guaranteed slot acquisition and distortion free recovered audio.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
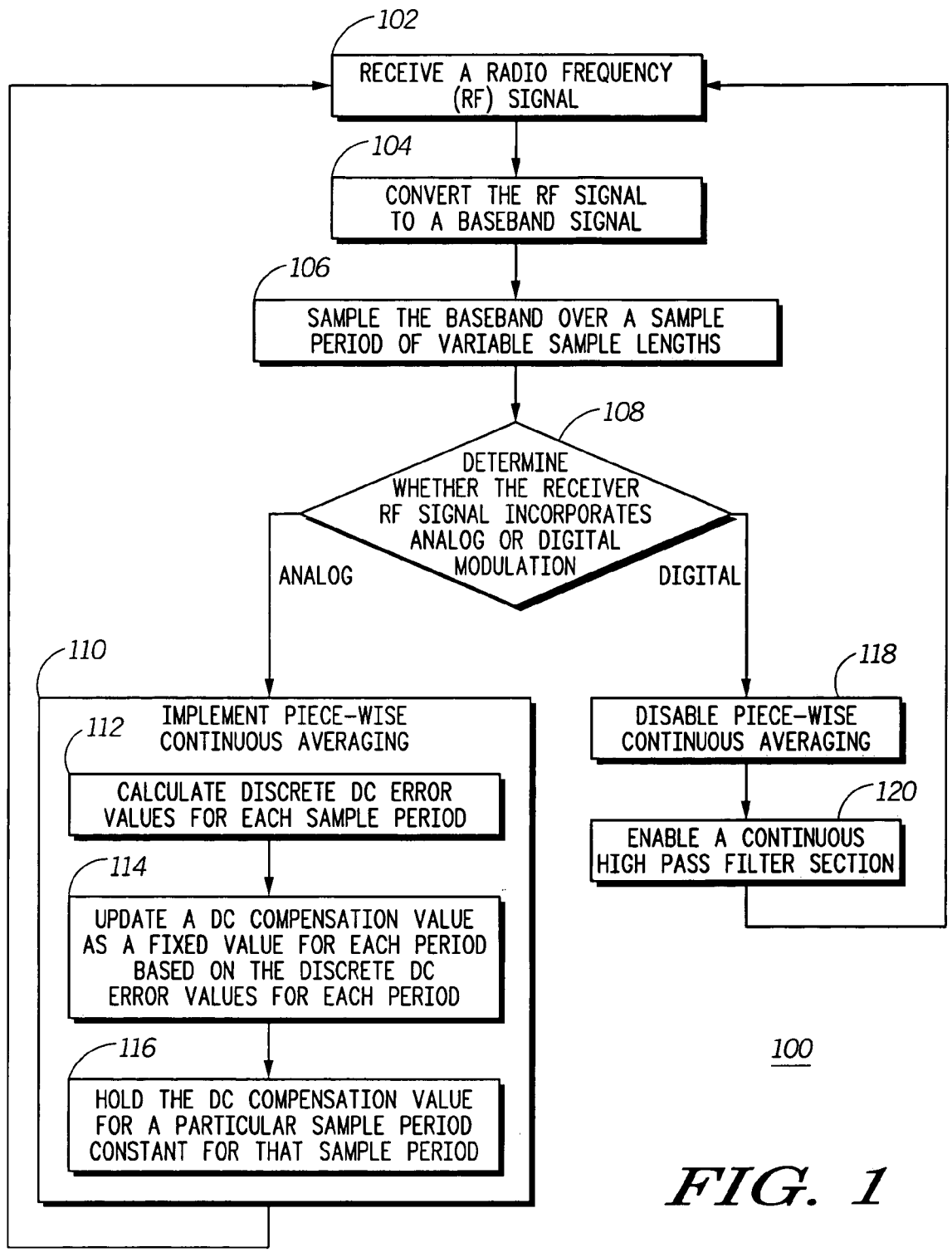
FIG. 1 is a method of compensating dc offset error in a direct conversion receiver that is digital signal processing (DSP) centric in accordance with the present invention.

While the specification concludes with claims defining the features of the invention that are regarded as novel, it is believed that the invention will be better understood from a consideration of the following description in conjunction with the drawing figures, in which like reference numerals are carried forward.

In accordance with the present invention, there is provided herein an adaptive dc compensation strategy that eliminates dc error for both digital and constant envelope modulation protocols. The dc compensation technique of the present invention is sufficiently flexible to provide sufficient slot acquisition and distortion-free recovered audio.

In accordance with the present invention, a dc averaging technique utilizes a piece-wise continuous dc averaging that calculates discrete dc error values over a variable number of samples and updates the dc compensation value as a fixed value for a specified sample length. The piece-wise "update-and-hold" technique of the present invention results in a pseudo high pass filter (HPF) response with an equivalent corner set by an integration length and integration factor used in the dc calculation. The calculation takes into account a variety of parameters including the operating protocol, the on-channel RF operating environment, off-channel dynamic interferers, targeted accuracy, and variations in the RF signal strength.

FIG. 1 is a flow chart illustrating a method of compensating dc offset error in a direct conversion receiver that is digital signal processing centric in accordance with the present invention. Method 100 begins by receiving a radio frequency (RF) signal at step 102, converting the RF signal to a baseband signal at step 104, and in accordance with the present invention sampling the baseband signal over a sampling period of variable sample lengths at step 106. The variable sample length can be, for example, between 10–500 mS of I/Q data. Next, by determining whether the received RF signal incorporates analog or digital modulation at step 108, the method splits into two separate paths, one that implements piece-wise continuous averaging and one that enables a high pass filter section of the receiver.

For received RF signals incorporating analog modulation (analog information encoded into modulation), the step of implementing piece-wise continuous averaging is performed at step 110 in accordance with the present invention. In accordance with the present invention, piece-wise continuous averaging comprises the steps of calculating discrete dc error values for each sample period at step 112; updating a dc compensation value as a fixed value for each sample period based on the discrete dc error values for each period at step 114; and holding the dc compensation value for a particular sample period constant for that sample period at step 116.

If at step 108, it is determined that the received RF signal incorporates digital modulation (binary information encoded into modulation), then piece-wise continuous averaging, if present, is disabled at step 118, and a continuous high pass filter section of the receiver is enabled at step 120 with a corner sufficiently low to eliminate baseband dc errors.

The piece-wise continuous averaging provided by steps 112, 114, and 116 provide an "update-and-hold" technique that results in a pseudo high pass filter (HPF) response with an equivalent corner. The equivalent corner is sufficiently low to eliminate baseband dc errors for analog protocols. The pseudo HPF corner is set by integration parameters including an integration length and integration factor alpha used in the dc error calculation at step 112. Additional details regarding the integration parameters are described in conjunction with FIG. 2.

Figure 2:
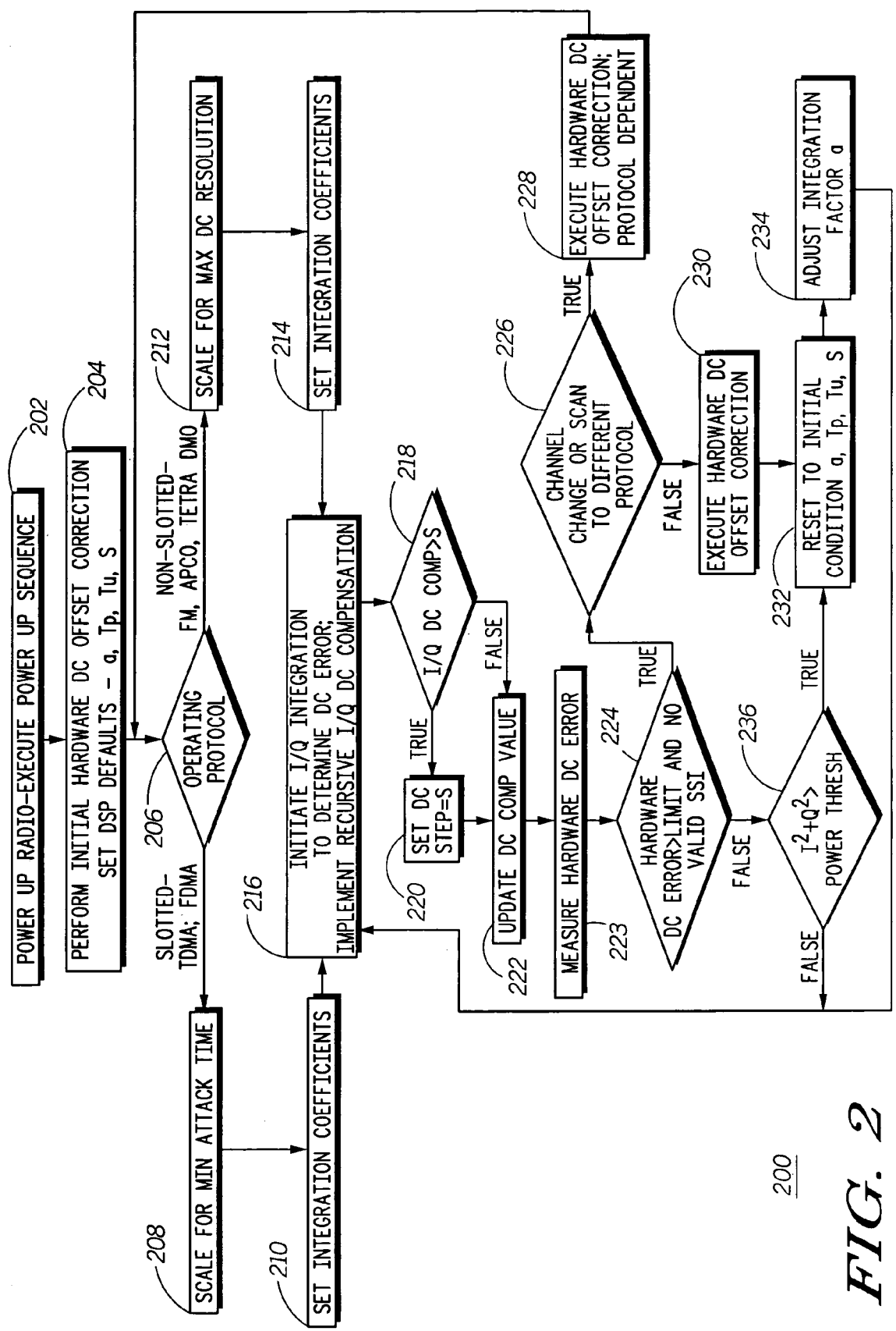
FIG. 2 is an example of a decision matrix for compensating dc offset error in a direct conversion receiver that integrates both DSP algorithmic methodologies and hardware dc offset correction strategies in accordance with an embodiment of the present invention.

FIG. 2 illustrates an example of a decision matrix 200 that can be used to implement the method of compensating dc offset error in a direct conversion receiver in accordance with an embodiment of the invention. Decision matrix 200 integrates both DSP algorithm methodologies and hardware dc offset correction strategies. At step 202, a receiver is powered up, goes through a power up sequence, and receives an RF signal. An initial hardware dc offset correction is determined based on initial operating parameters upon power up at step 204. Digital signal processing (DSP) parameters are set to predetermined default settings at step 204 as well. These DSP parameters preferably include an alpha integration factor "a"; an integration period or length, Tp; a dc compensation update rate (which must be at least larger than Tp), Tu; and a maximum dc update step size, S. The integration period, Tp, is the number of samples used in calculating the dc average. The maximum dc update step size, S, is the amount of change in dc compensation allowed between contiguous updates.

At step 206, the type of operating protocol (digital or analog) is determined based on whether the signals are slotted or non-slotted. Examples of slotted signals include TDMA, FDMA, and many others. Examples of non-slotted (or pseudo non-slotted) signals include FM, APCO, and Tetra DMO to name a few. Decision matrix 200 splits off into two separate paths at this point, depending on whether the operating protocol is analog or digital.

For a digital protocol, the resolution of the dc offset is scaled for minimum attack time at step 208. The dc offset error scaling is preferably set to unity gain maintaining the I/Q resolution to one least significant bit (1 LSB). The integration coefficients are then set at step 210 based on the type of protocol, in this case digital. Examples of the range for the integration coefficient through the digital path might be as follows: alpha, a ~0.9995–0.9999; integration period, Tp ~10–25 mS, Tu~Tp+0% to 20% delay, and S: set 4<S<8 LSBs.

When an analog operating protocol is determined at step 206, resolution of the dc offset is scaled for maximum dc resolution at step 212. This scaling is preferably accomplished by setting the gain of the I/Q word to scale by 2–3 bits or 12–18 dB. The integration coefficients are then set based on the protocol type, in this case analog at step 214. Examples of the range for the integration coefficient through the analog path might be as follows: alpha, a ~0.99995 to 0.9999875, Tp~100–250 ms, Tu~Tp+0% to 50% delay, and S: set 1<S<3 LSBs.

Once the integration coefficients are set at step 210 or 214 for the digital or analog protocols, I/Q integration is initiated to determine dc offset error and a recursive I/Q dc compensation value is implemented at step 216. Step 216 coincides with step 112 of FIG. 1, and steps 218, 220, and 222 correspond to step 114 of FIG. 1. All integration occurs at step 216 with the calculation of a dc reference value in the I and Q word. Note that the dc offset error is the difference between the dc reference value calculated for any two contiguous I/Q sample lengths. The dc reference value embedded in the I/Q word can be determined based on the following equations:

$$Idc(n)=a*Idc(n-1)+(1-a)*I(n)$$

$$Qdc(n)=a*Qdc(n-1)+(1-a)*Q(n), \text{ for } n=1 \text{ to } Tp.$$

Other integration means can be used as well, such as moving averaging and exponential averaging to name a few.

The I/Q dc compensation value calculated at step 216 is compared at step 218 to the maximum dc update step size, S that was set as a default back at step 210 or 214. If the change in the present I/Q dc compensation value relative to the preceding dc compensation value is larger than the maximum step size, S, then the dc step size is set to that maximum step size S at step 220 and the differential change (+or−S) relative to the preceding dc correction value is updated into the DSP decoding algorithm at step 222. On the other hand, if the I/Q dc compensation step size relative to the preceding dc compensation value at step 218 is not smaller than the maximum dc update step size, S, then the dc compensation value is updated directly into the DSP decoding algorithm at step 222.

At step 223, the dc offset error at the input to the Analog-to-Digital Converter (ADC) in the analog baseband path is measured in the receiver. At step 224, the measured dc error at the ADC input is compared to a predetermined limit and a check is made to determine that a valid received signal is still present. Received signal strength can be checked with a received signal strength indicator (RSSI). If the dc error at the ADC input (or hardware based dc error) exceeds a predetermined limit and no valid receive signal is present at step 224 then a hardware centric dc offset correction (DCOC) sequence can be initiated; however, the metrics controlling the hardware DCOC is dependant on the cause for these conditions as determined at step 226. Various adjustments can be made through a variety of paths depending on the cause. If either a channel change or scanning with a different protocol was the cause for the drop in signal and hardware dc error, as determined at step 226, then a hardware dc offset correction based on protocol occurs at step 228 and the matrix returns to step 206. If a channel change or scan was not the cause of the error, then the cause is assumed to be most likely a fade or pause in the received signal. A hardware dc offset correction, based on the pause/fade assumption, is executed at step 230. The initial integration parameters a, Tp, Tu, and S are then reset to initial conditions at step 232, these conditions having been set back at steps 210 or 214. The integration factor alpha, "a", is adjusted at step 234 prior to returning to the step of integration at step 216.

Returning back to step 224, if the dc error at the input of the ADC does not exceed the limit and a valid received signal strength is present, then the RF input power (proportional to $I^2+Q^2$) is compared to a predetermined power threshold at step 236. If the power threshold is not exceeded at step 236, then the matrix returns back to step 216 to continue the recursive I/Q dc compensation since the receiver is still operating in a relatively week signal condition. Thus, under weak signal conditions, the integration is continued with the dc error at the input of the ADC and the operating RF power level of the received signal being continually monitored, at blocks 224 and 236 respectively, in a closed loop system. Under strong signal conditions, the initial parameters are reset at step 232 (with parameters values from 210 or 214) and the integration factor is adjusted (loosened) at step 234 prior to returning to the step of integration at step 216. An example of relaxing the signal conditions at step 234 can be accomplished by adapting the alpha factor 20 percent high for 1000 samples.

Originating from decision block 236, path, 232, 234, to 216 is taken under strong signal conditions. Appropriate changes in the alpha factor "a" at step 234 can accelerate the integration period at step 216. Originating from decision block 236, direct access to block 216 occurs under weak signal conditions and no adjustment to alpha (or any other parameter) is made. Originating from decision block 224, a hardware DCOC is initiated through 226, 228 ending in protocol interrogation block 206 only if it is determined that no desired RF signal is being received and a change to a different operating protocol has been initiated though channel change or automatic scanning. An alternative hardware centric DCOC can be initiated for the present operating protocol environment as predicated in block 224, by sequencing through block 226 and 230 and merging into a subsequent DSP centric integration loop at block 232. After merging into block 232, the standard DSP integration sequence previously described at the beginning of the paragraph is initiated.

Accordingly, decision matrix 200 demonstrates how the dc integration factor alpha, integration period, Tp, update rate, Tu, and step size, S are scaled based on a variety of factors that include the operating protocol (step 206), the on-channel RF operating environment (receive signal strength indicator—step 236), operational conditions of the receiver's hardware (step 224) and the possible increase in vulnerability to off-channel dynamic interferers (step 226). More specifically, the alpha factor is adjusted (step 234) based on the allowable integration period and targeted accuracy (steps 224) where higher alpha's result in longer integration times, but higher accuracy. Variations in the RF signal strength indicator ($I^2+Q^2$) (step 236) may be used to adapt the dc compensation step size, S, (step 232). The integration period, Tp, is adapted depending on both operating protocol (step 206) and the rate of change in the RF signal strength indicator (step 236). While described in the order shown of FIG. 2, one skilled in the art appreciates that the order of many of the steps can be altered. Steps 223, 224, 226, 228, and 230, for example, can be implemented at other areas of the flowchart.

Figure 3:
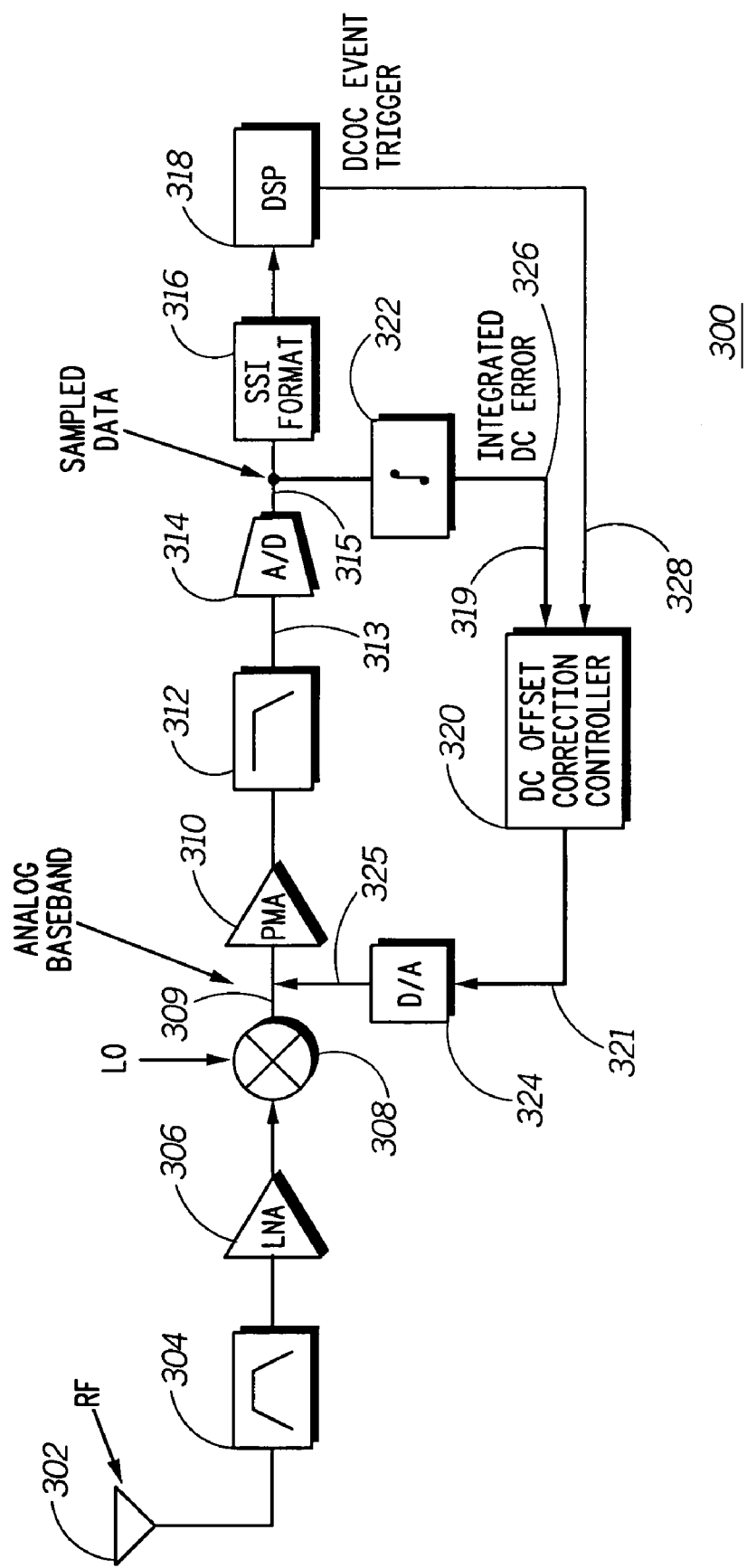
FIG. 3 is a block diagram of a direct conversion receiver operating in accordance with the present invention.

Referring now to FIG. 3, there is shown a block diagram for a receiver formed in accordance with the present invention. Receiver 300 is a direct conversion receiver that receives an RF signal 302 through a band pass filter 304 and low noise amplifier 306. The RF signal is mixed with a local oscillator (LO) signal at mixer 308 to generate an analog baseband signal. The analog baseband signal is adjusted with a dc offset correction factor that is generated through a feedback path 319 having a dc offset correction controller 320 operating in accordance with the present invention. The dc offset correction controller 320 of the present invention performs steps similar in function to those found in 114, 116 of FIG. 1 and steps 220–234 of FIG. 2.

The adjusted analog baseband signal 309 is amplified through post-mixer amplifier (PMA) 310 and filtered through low pass filter section 312 (multiple stages can be used to accomplish this function). The filtered signal 313 is sampled at the analog-to-digital converter (A/D) 314 and the dc offset error is accumulated via integrator 322 in accordance with the present invention. The conversion of the analog baseband signal to digital samples at 314 correspond to the sampling step 106; the integration and control block 322 and 320 is a hardware realization (having less control and resolution) and calculating step 112 of FIG. 1 and step 216 of FIG. 2. The digital signal 315 is also forwarded to a standard Synchronous Serial Interface (SSI) format block 316 for formatting the signal and providing it to a digital signal processor (DSP) 318.

In accordance with the present invention, an integrated dc error 326 is generated from integrator 322. This integration coincides with step 112 of FIG. 1 and step 216 of FIG. 2. The integrated dc error 326 and a dc offset correction (DCOC) event trigger 328 are processed by the dc correction controller 320 to provide a dc correction factor (in digital form) 321. Digital to analog converter 324 converts the digital correction factor 321 to analog to provide an analog dc offset correction 325 to resolve error at the A/D 314 input. The dc offset correction controller 320 holds the dc correction 325 at D/A 324 output constant, and facilitates the continuous piece-wise dc error correction at the DSP 318 to reduce error. For digital protocols controller 320 can be set to continuously monitor and correct the baseband signal 309 using the step 120 described in FIG. 1 or steps 226, 228 of FIG. 2. The dc correction value at 325 is held constant until the DSP detects an offset error that exceeds a preset threshold (FIG. 2, step 224), then the DSP triggers, via trigger 328, another hardware dc offset correction 325 by dc offset correction controller 320. The updated dc compensation value is converted to analog via D/A 324 and is applied to analog baseband signal 309.

Those skilled in the art will appreciate that a similar topology is evident for Zero IF (ZIF) dual (or multiple) conversion receivers, with exceptions to the previous descriptions being the incorporation of a second down mixer between first down mixer 308 and PMA 310. The first down mixer 308 would be altered to mix the RF to a secondary intermediate frequency (IF) with the second down mix operation mixing the IF to baseband prior to being routed to PMA 310. In addition, the dc offset correction access point 325 connecting DAC 324 to the interface between block 309 and 310 can be connected after any subsequent baseband stage between 310 and ADC 314. Each access connection for 325 to the baseband between 310 and 314 can be selected at the discretion of the designer with insight to various advantages and disadvantages of each access point Accordingly, there has been provided a means for minimizing baseband offset in a receiver utilizing piece-wise continuous averaging that calculates discrete dc error values over a variable number of samples and updates a dc compensation value as a fixed value for a specified sample length. As described above the piece-wise "update-and-hold" technique of the present invention results in a pseudo high pass filter (HPF) response with an equivalent corner set by an integration length and integration factor used in the dc calculation.

Increasing integration factor "a" and frequency of dc compensation update improves the overall effectiveness and accuracy of the dc compensation as demonstrated by the reduction in dc compensated standard deviation. The integration factor and compensation timing, as well as other variables, can be tailored to meet specific protocol requirements as necessary.

By making discrete updates to the dc compensation value, the desired information that would have been eliminated by a continuous high pass filter approach is preserved, thus allowing proper demodulation resulting in superior, distortion free recovered audio for constant envelope modulation, and optimally minimized BER noise floor for digital protocols. The technique is adaptable on a per-protocol basis and dynamic RF environments, thus providing a strategy that is maximally flexible. The hybrid combination of fixed hardware correction techniques and DSP correction afford optimal efficiency requiring less MIPS than DSP correction strategies depending wholly on arithmetic processing to achieve the desired correction. In addition, the dc compensation technique of the present invention allows the same methodology to be utilized for both digital and analog modulation protocols, avoiding the legacy need for different filter structures with varying FIR TAP requirements to satisfy conflicting requirements from various applications.

The dc averaging technique of the present invention can be used in direct conversion receivers, ZIF based dual conversion receivers, and is particularly desirable in high speed data (HSD) SAM/APCO compliant receivers given that APCO-FM-SAM requirements necessitate enhanced dc error correction capability.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A dc averaging technique for a direct conversion receiver, comprising the steps of:
   receiving a radio frequency (RF) signal;
   converting the received RF signal to a baseband signal, the baseband signal being subject to dc offset caused by a plurality of dc error sources;
   calculating discrete dc error values independent of the plurality of dc error sources, over a variable number of samples using piece-wise continuous dc averaging to generate a dc compensation value;
   updating the dc compensation value as a fixed value for each sample to approximate a high pass filter response with an equivalent corner;
   applying the updated dc compensation value to the baseband signal;
   wherein the step of updating the dc compensation value includes adjusting an alpha factor, used in the discrete error calculation, based on an allowable integration period and targeted accuracy.

2. The dc averaging technique of claim 1, wherein the step of updating the dc compensation value occurs over a predetermined step size and update rate.

3. The dc averaging technique of claim 2, wherein the step size is adapted based on at least one of: operating protocol, on-channel RF operating environment, possible off-channel dynamic interferers, and variations in power of the received RF signal power.

4. The dc averaging technique of claim 1, wherein the integration period is adapted depending on both operating protocol and the rate of change in the received RF signal power.

5. A method of compensating dc offset error in a direct conversion receiver, comprising:
   receiving a Radio Frequency (RF) signal;
   converting the RF signal to a baseband signal;
   sampling the baseband signal over a sampling period of variable sample lengths;
   determining whether the received RF signal incorporates analog or digital modulation;
   for received RF signals incorporating analog modulation, implementing piece-wise continuous averaging comprised of:
   calculating discrete dc error values for each sample period;
   updating a dc compensation value as a fixed value for each sample period based on the discrete dc error values for each period;
   holding the dc compensation value for a particular sample period constant for that sample period; and
   for received RF signals incorporating digital modulation, disabling the piece-wise continuous averaging; and
   enabling a continuous high pass filter section of the receiver with corner sufficiently low to eliminate baseband dc errors response for digital protocols.

6. An apparatus for compensating dc offset in a direct conversion receiver, including:
   means for converting an RF signal to a baseband signal, the baseband signal being subject to dc offset caused by a plurality of dc error sources;
   an amplifier for amplifying the baseband signal and providing an amplified signal;
   a low pass filter for filtering the amplified signal to provide a filtered signal;
   an analog-to-digital converter for converting the filtered signal to a digital signal;
   an integrator for sampling the digital signal over a sample period of variable lengths and calculating a discrete integrated dc error value for the sample period, regardless of the dc error source;
   a controller for receiving the calculated dc error value and updating and holding an updated dc compensation value as a fixed value for each period based on the discrete error value for each period;
   a digital signal processor for triggering the controller to update the dc compensation value; and
   a digital-to-analog converter for converting the updated dc compensation value to an analog signal to be applied to the baseband signal.

7. A method for minimizing baseband offset error in a receiver, including the step of:
   receiving a radio frequency (RF) signal;
   converting the RF signal to a baseband signal;
   determining a modulation protocol of the received RF signal as being one of: digital modulation and analog modulation;

initiating a dc compensation value based on the modulation protocol;
for the analog modulation protocol:
holding the dc compensation value constant while initiating continuous piece-wise dc error correction to reduce error in the baseband signal; and
for the digital modulation protocol:
enabling a hardware dc offset correction in response to a second set of signal conditions to reduce error in the baseband signal.

8. The receiver of claim 7, wherein the step of enabling a hardware dc offset correction comprises the step of enabling a continuous high pass filter section of the receiver.

9. The receiver of claim 7, wherein the step of initiating continuous piece-wise dc error correction results in an approximation of a high pass filter response with equivalent corner.

10. A method of compensating dc offset error in a direct conversion receiver, comprising:
receiving a radio frequency (RF) signal having an operating protocol;
measuring an initial dc hardware offset error;
performing an initial hardware dc offset correction using preset default DSP parameters: alpha, integration period, update rate, and step size (a, Tp, Tu, and S respectively);
determining whether the operating protocol is analog or digital;
scaling the dc offset based on the operating protocol;
resetting the DSP parameters based on the operating protocol;
initiating I/Q integration to determine dc offset error;
calculating an I/Q dc compensation value based on the determined dc offset error;
comparing the calculated I/Q dc compensation value to a maximum dc update step size provided by the reset DSP parameter, S;
updating the dc compensation value based on the step of comparing;
remeasuring the hardware dc offset error;
comparing the remeasured hardware dc offset error to predetermined limits;
determining signal strength conditions, if the dc offset error does not exceed the predetermined limits;
under weak signal conditions, returning to the step of initiating the I/Q integration; and
under strong signal conditions, resetting the DSP parameters and adjusting the integration factor, a, prior to returning to the step of integration;
determining a cause for the hardware dc offset error, if the dc offset error does exceed the predetermined limits;
executing a hardware dc offset correction based on the cause of the hardware dc offset error;
returning to the step of determining whether the operating protocol is analog or digital when the cause of the hardware dc offset error is due to a channel or scan change; and
resetting the DSP parameters, adjusting the integration factor and returning to the step of initiating I/Q integration, when the cause of the hardware dc offset error is not due to channel or scan change.

11. The method of claim 10, wherein the step of initiating I/Q integration to determine dc offset error utilizes the following:

$$Idc(n)=a*Idc(n-1)+(1-a)*I(n)$$

$$Qdc(n)=a*Qdc(n-1)+(1-a)*Q(n), \text{ for } n=1 \text{ to Tp}.$$

* * * * *